United States Patent
Schubert

(10) Patent No.: US 9,653,255 B2
(45) Date of Patent: May 16, 2017

(54) SCANNING PARTICLE MICROSCOPE HAVING AN ENERGY SELECTIVE DETECTOR SYSTEM

(71) Applicant: Carl Zeiss Microscopy GmbH, Jena (DE)

(72) Inventor: Stefan Schubert, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 14/252,034

(22) Filed: Apr. 14, 2014

(65) Prior Publication Data

US 2014/0306110 A1 Oct. 16, 2014

(30) Foreign Application Priority Data

Apr. 15, 2013 (DE) .......................... 10 2013 006 535

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/2446* (2013.01);
(Continued)

(58) Field of Classification Search
USPC ............ 250/305, 306, 307, 310, 311, 396 R
See application file for complete search history.

(56) References Cited

U.S. PATENT DOCUMENTS

| | | | | |
|---|---|---|---|---|
| 4,205,226 A | * | 5/1980 | Gerlach | ............... G01N 23/227 250/305 |
| 4,486,659 A | * | 12/1984 | Turner | .......................... 250/306 |

(Continued)

FOREIGN PATENT DOCUMENTS

| DE | 35 32 781 A1 | 3/1987 |
|---|---|---|
| DE | 36 38 682 A1 | 5/1988 |

(Continued)

OTHER PUBLICATIONS

O. Jbara et al., "Surface potential measurements of electron-irradiated insulators using backscattered and secondary electron spectra from an electrostatic toroidal spectrometer adapted for scanning electron microscope applications", Review of Scientific Instruments, vol. 72, No. 3, Mar. 2001, pp. 1788-1795.

(Continued)

*Primary Examiner* — Michael Logie
(74) *Attorney, Agent, or Firm* — Fish & Richardson P.C.

(57) ABSTRACT

The disclosure provides a scanning particle beam microscope for inspecting an object. The scanning particle beam microscope includes a particle optical system having an objective lens. The microscope further includes a detector system having a particle optical detector component configured to generate an electrostatic field in the beam path of particles emitted from the object. The detector system is configured to spatially filter the emitted particles after the emitted particles have passed through the electrostatic field and to detect a portion of the filtered emitted particles. The particle optical detector component is configured such that the spatial filtering filters the emitted particles according to a kinetic energy of the emitted particles.

46 Claims, 10 Drawing Sheets

(52) U.S. Cl.
CPC ........... *H01J 2237/24485* (2013.01); *H01J 2237/24578* (2013.01); *H01J 2237/24585* (2013.01)

(56) References Cited

U.S. PATENT DOCUMENTS

| | | | | |
|---|---|---|---|---|
| 4,714,833 | A * | 12/1987 | Rose et al. ................... | 250/397 |
| 4,812,651 | A * | 3/1989 | Feuerbaum et al. .......... | 250/310 |
| 4,882,486 | A * | 11/1989 | Kruit ............................ | 250/305 |
| 5,032,724 | A * | 7/1991 | Gerlach et al. .............. | 250/305 |
| 5,408,098 | A * | 4/1995 | Wells ........................... | 250/310 |
| 5,466,940 | A * | 11/1995 | Litman et al. ................ | 250/397 |
| 6,646,262 | B1 * | 11/2003 | Todokoro ............. | H01J 37/244 850/9 |
| 6,847,038 | B2 * | 1/2005 | Todokoro ............. | G01N 23/225 250/305 |
| 7,928,381 | B1 | 4/2011 | Kelly et al. | |
| 2001/0010357 | A1 * | 8/2001 | Ose ...................... | H01J 37/147 250/311 |
| 2003/0066961 | A1 * | 4/2003 | Kienzle et al. .............. | 250/306 |
| 2003/0127604 | A1 * | 7/2003 | Todokoro et al. ........... | 250/436 |
| 2004/0051041 | A1 * | 3/2004 | Todokoro .............. | G01N 23/225 250/310 |
| 2004/0108457 | A1 * | 6/2004 | Kienzle et al. .............. | 250/310 |
| 2004/0245465 | A1 * | 12/2004 | Steigerwald et al. ........ | 250/310 |
| 2006/0151711 | A1 * | 7/2006 | Frosien ................. | H01J 37/05 250/396 ML |
| 2006/0289804 | A1 * | 12/2006 | Knippelmeyer et al. ........................... | 250/492.22 |
| 2008/0073529 | A1 * | 3/2008 | Adler ................... | G01N 23/225 250/307 |
| 2008/0099674 | A1 * | 5/2008 | Bihr ....................... | G03F 1/72 250/307 |
| 2009/0200463 | A1 * | 8/2009 | Degenhardt .......... | H01J 37/244 250/307 |
| 2009/0309024 | A1 | 12/2009 | Steigerwald et al. | |
| 2009/0321634 | A1 * | 12/2009 | Khursheed .................... | 250/307 |
| 2010/0163725 | A1 * | 7/2010 | Barkshire ............... | H01J 37/05 250/305 |
| 2010/0187436 | A1 * | 7/2010 | Frosien et al. ................ | 250/424 |
| 2010/0237240 | A1 * | 9/2010 | Watson et al. ................ | 250/305 |
| 2011/0139983 | A1 * | 6/2011 | Doi ................................ | 250/307 |
| 2013/0056634 | A1 * | 3/2013 | Sluijterman et al. ......... | 250/307 |
| 2013/0256528 | A1 * | 10/2013 | Xiao et al. .................... | 250/307 |
| 2013/0256556 | A1 * | 10/2013 | Hofmann ...................... | 250/398 |
| 2013/0292568 | A1 * | 11/2013 | Bizen .................... | G01B 15/00 250/307 |
| 2014/0124666 | A1 * | 5/2014 | Sasaki .................... | H01J 37/05 250/310 |
| 2014/0284476 | A1 * | 9/2014 | Ren ........................ | H01J 37/05 250/310 |
| 2014/0299767 | A1 * | 10/2014 | Bizen .................... | H01J 37/28 250/307 |

FOREIGN PATENT DOCUMENTS

| | | |
|---|---|---|
| DE | 103 01 579 A1 | 7/2004 |
| DE | 10 2006 043 895 A1 | 3/2008 |
| EP | 0 689 063 A2 | 12/1995 |
| EP | 0 721 201 B1 | 8/1998 |
| EP | 1 439 565 A2 | 7/2004 |
| WO | WO 2012/081428 | 6/2012 |

OTHER PUBLICATIONS

German Office Action, with translation thereof, for corresponding DE application No. 10 2013 006 535.6 dated Dec. 18, 2013.
Dutch Office Action, with translation thereof, for Dutch Appl No. 2012618, dated Dec. 2, 2015.

* cited by examiner

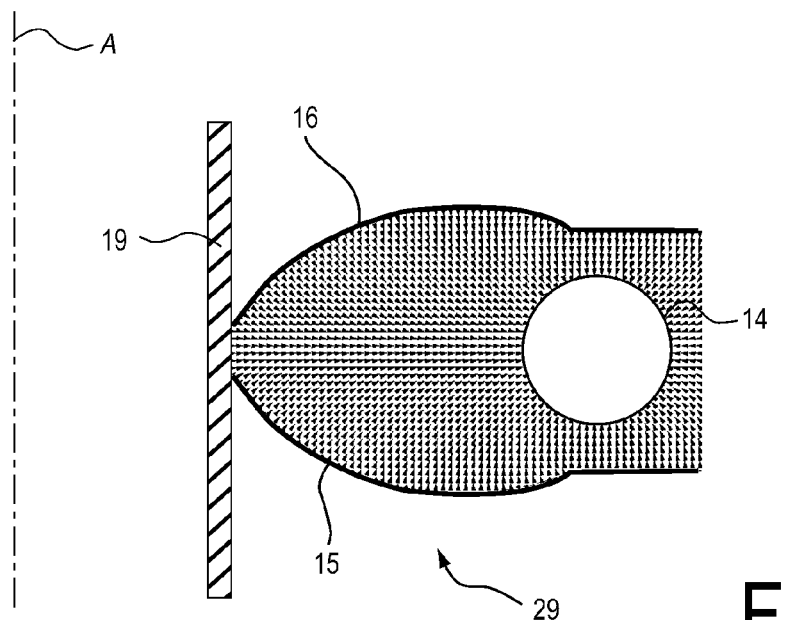
Fig. 4A
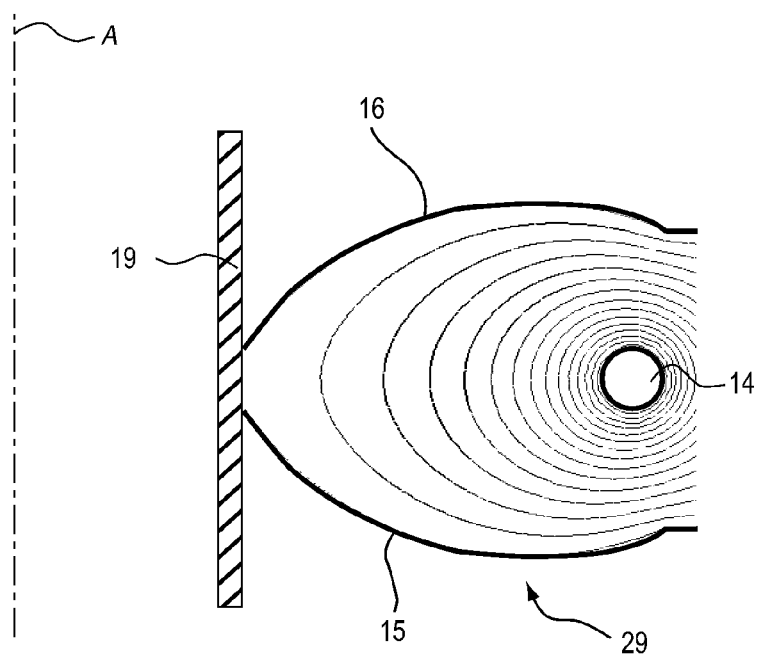
Fig. 4B
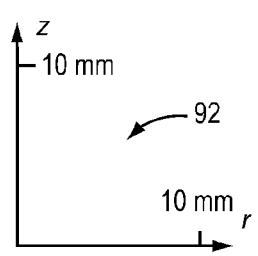

SCANNING PARTICLE MICROSCOPE HAVING AN ENERGY SELECTIVE DETECTOR SYSTEM

CROSS-REFERENCES TO RELATED APPLICATION

This application claims priority under 35 U.S.C. §119 to German Patent Application No. 10 2013 006 535.6, filed Apr. 15, 2013, the entire contents of which are incorporated by reference herein.

FIELD

The present disclosure relates to a scanning particle microscope having a detector system for detecting particles, which are emitted from an interaction region where the primary particle beam interacts with the object. More specifically, the present disclosure relates to a scanning particle microscope, having a detector system configured to detect the particles in an energy selective and/or solid angle selective manner.

BACKGROUND

Over the years, a variety of different spectrometers for inspecting the energy of secondary electrons and/or backscattered electrons in scanning electron microscopes have been developed. These spectrometers, can only be arranged outside of the electron optical systems due to their size and geometry and also due to the fact that they need to be disposed close to the object in order to collect as many particles as possible.

However, arranging the spectrometer outside of the electron optical system and close to the object involves the objective lens to be positioned at a comparatively large distance from the object. The large distance between the objective lens and the object leads to increased aberrations of the primary beam and, hence, imposes a limit on the attainable spatial resolution of the scanning electron microscope.

Therefore, a need exists for providing a particle beam microscope, which includes a detector system having a compact design and which allows to efficiently filter particles according to their energy.

SUMMARY

Embodiments provide a scanning particle beam microscope for inspecting an object, the scanning particle beam microscope comprising: a particle optical system having an objective lens, wherein the objective lens is configured to focus a primary beam of the scanning particle microscope on an object region of the particle optical system, such that particles are emitted from the object. The emitted particles may pass through a principal plane of the objective lens. The scanning particle beam microscope may further comprise a detector system comprising a particle optical detector component configured to generate an electrostatic field in the beam path of the emitted particles. The field may be at least partially arranged outside of an objective lens field of the objective lens. The detector system may be configured to spatially filter the emitted particles after the emitted particles have passed through the field and to detect a portion of the filtered emitted particles. The particle optical detector component may be configured such that the spatial filtering filters the emitted particles according to a kinetic energy of the emitted particles.

Thereby, a scanning particle beam microscope is provided, which includes a detector system having a compact design and which allows efficient energy filtering. Since the emitted particles pass through the principal plane of the objective lens, it is possible to position the objective lens close to the object. Hence, aberrations of the primary beam are reduced, which allows high-resolution imaging.

The scanning particle beam microscope may be a scanning electron microscope and/or a focus ion beam microscope. The focus ion beam microscope may comprise a gas field ion source, a plasma ion source and/or a liquid metal ion source. By way of example, the focus ion beam microscope is a helium ion microscope.

The object region may be defined as a spatial region, across which the primary beam is scannable. A surface portion of the object, which is arranged in the object region may be microscopically imagable by the scanning particle beam microscope. The particle optical system may comprise a scanning system for laterally (i.e. in a direction perpendicular to the axis of the particle beam) scanning the particle beam across the object region.

The objective lens field may be configured to focus the primary beam exiting from a particle source or from a condenser system on the object region. The objective lens field may comprise a magnetic field and/or an electric field. In other words, the objective lens may be an electrostatic objective lens, a magnetic objective lens or a combined electrostatic-magnetic objective lens. The focus in the object region may for example have a diameter in the range of between 0.5 nanometers and 100 nanometers, or in the range of between 0.5 nanometers and 10 nanometers.

The emitted particles may be primary particles, which are scattered from the interaction region, and/or object particles, which are emitted from the interaction region. If the scanning particle microscope is configured as a scanning electron microscope, the primary particles, which are scattered from the interaction region may be backscattered electrons and the object particles may be secondary electrons. If the scanning particle microscope is configured as a helium ion microscope, the primary particles, which are scattered from the object may be backscattered helium ions and the object particles may be secondary electrons and/or secondary ions.

The emitted particles pass trough the principal plane of the objective lens. The principal plane may be limited to the region of the objective lens field. Thereby, the principal plane, may be defined such that it is not a mathematical plane of infinite extent. The emitted particles may pass through a portion of the objective lens field or through the whole objective lens field. At least a segment of the beam path of the emitted particles may travel along a direction, which is reverse or substantially reverse to a direction of a segment of the beam path of the primary beam. The segments may extend through the principal plane. The segments may extend at least between the object region and the particle optical detector component or between the object region and a spatial filter of the detector system. At least a portion of the segments extend within the particle optical system.

The particle optical system may comprise an electrode for guiding the emitted particles through the principal plane. The electrode may be a liner tube. The liner tube may at least partially surround at least a segment of the primary beam path.

At least a portion of the detector system or at least a portion of the particle optical detector component may be arranged within or outside of the particle optical system. At least a portion of the detector system or at least a portion of the particle optical detector component may be arranged between the objective lens field and the condenser field of the condenser system, or may be disposed within the liner tube.

At least a portion of the field is located outside of the objective lens field. At least a portion of the field may be located between the principal plane of the objective lens field on one side and a particle receiving surface and/or a spatial filter of the detector system on the other side. The beam path of the primary particle beam may extend outside of the field of the particle optical detector component. A maximum radial distance of the field from the axis of the primary beam may be smaller than 200 millimeters, or smaller than 150 millimeters, or smaller than 100 millimeters, or smaller than 70 millimeters, or smaller than 50 millimeters.

The field may have a converging or diverging particle optical effect on the incident emitted particles. The converging or diverging particle optical effect may depend on the kinetic energy of the emitted particles. For emitted particles of a same kinetic energy, the field may generate a convergent or a divergent beam. A convergence or divergence of the generated convergent or divergent beam may depend on the kinetic energy. A converging particle optical effect may for example increase the convergence of the emitted particles, reduce the divergence of the emitted particles or transform a divergent particle beam path into a convergent particle beam path. A diverging particle optical effect may for example increase the divergence, reduce the convergence or transform a convergent beam path into a divergent beam path.

The detector system may include a spatial filter, which may be arranged in the beam path of the emitted particles downstream of the particle optical detector component.

According to an embodiment, the field is configured to generate for each of at least two different and/or non-overlapping energy ranges of the kinetic energy an intensity profile across the spatial filter, wherein the intensity profiles of the energy ranges are different from each other. The filtering according to the kinetic energy may be performed depending on the different intensity profiles.

The filtering according to the kinetic energy of the emitted particles may suppress a detection of the emitted particles of the first energy range relative to a detection of the emitted particles of the second energy range.

By way of example, for emitted particles of different kinetic energy ranges, the field may generate focus regions or regions of divergence, which have different extents and/or different locations relative to the spatial filter. The different extents and/or the different locations may result in different intensity profiles across the spatial filter, in particular across a plane defined by the spatial filter, in which the emitted particles are filtered. The plane defined by the spatial filter may be a plane in which a particle receiving surface and/or an aperture stop is arranged. Thereby, the energy filtering may be performed depending on the different intensity profiles across the spatial filter.

The field may be configured such that at least a portion of the emitted particles are deflected after having traversed the field. In addition to the deflection, the field may vary a kinetic energy of the emitted particles.

The detector system is configured to spatially filter the emitted particles after the emitted particles have passed through the field. The detector system may include an aperture stop and/or a particle receiving surface of a detector, which may act as a spatial filter. The detector system may include a detector having a through-opening. One or more particle receiving surfaces of the detector may be arranged circumferentially around the through-opening. The through-opening of the detector may constitute a spatial filter for the emitted particles. Thereby, the detector may act as an aperture stop.

The energy filtering may suppress a detection of emitted particles, which have a kinetic energy outside of a pre-determined energy range. Outside of the pre-determined energy range, the detection may be suppressed relative to the detection of emitted particles, having a kinetic energy within the pre-determined energy range. The pre-determined energy range may be a portion of a range over which the energy distribution of the emitted particles extends. The energy distribution may be defined as a function of the intensity of the emitted particles over the kinetic energy of the emitted particles. The energy distribution may be measured at a location of the beam path. The location may be where the emitted particles enter the field.

By way of example, by applying the energy filtering, more than 50%, or more than 60%, or more than 70%, or more than 80%, or more than 90% of the emitted particles may be detected, which have a kinetic energy in the pre-determined energy range. Furthermore, by way of example, by applying the energy filtering, less than 50%, or less than 30%, or less than 10%, or less than 5% of the emitted particles may be detected, which have a kinetic energy outside of the pre-determined energy range.

The detector system may include a detector, which detects at least a portion of the filtered emitted particles. The detector may have an energy-dependent sensitivity. In other words, in addition to the energy filtering performed by the spatial filter, a further energy filtering may be performed by the energy-dependent sensitivity of the detector.

According to an embodiment, the particle optical detector component comprises a first grid electrode portion, through which the emitted particles enter into the field and a second grid electrode portion through which the emitted particles exit from the field. The first grid electrode portion may be different from the second grid electrode portion. The energy filtering may be performed after the emitted particles have exited from the field through the second grid electrode portion. The spatial filter may be arranged in the beam path of the emitted particles downstream of the second grid portion.

According to a further embodiment, the particle optical detector component comprises a field electrode and a counter electrode arrangement, wherein the field is generated between the field electrode and the counter electrode arrangement.

According to a further embodiment, the field electrode comprises a passage opening through which the emitted particles pass.

According to a further embodiment, the counter electrode arrangement comprises a first grid electrode portion through which the emitted particles enter into the field and a second grid electrode portion through which the emitted particles exit from the field.

Thereby, a detector system is obtained which has a compact configuration and which allows efficient energy filtering of the emitted particles. The compact configuration allows the detector system to be arranged in the interior of the particle optical system.

The scanning particle beam microscope may be configured such that the emitted particles pass through a principal plane of the objective lens.

Each of the field electrode and the counter electrode arrangement may be connected to a voltage source. The field electrode and/or the counter electrode arrangement may be conductive. The potential of the counter electrode arrangement may be constant across the entire surface of the counter electrode arrangement. This may also apply to the field electrode. The field is generated by the field electrode and the counter electrode arrangement. All field lines of the field may start from the surface of the field electrode and terminate on the surface of the counter electrode arrangement, or all field lines may start from the surface of the counter electrode arrangement and terminate on the surface of the field electrode.

The field may be inhomogeneous. The electric field strength on a surface portion of the field electrode, which faces the beam path of the emitted particles, may be at least twice as high or at least five times as high, or at least seven times as high, or at least ten times as high as a maximum electric field strength on the first and/or on the second grid electrode portion. When calculating the field strength, spatial fluctuations may be averaged out, which are caused by small surface radii at the openings of the grid electrode portions. By way of example, the electric field strength may be averaged over one, two, or more grid openings.

The counter electrode arrangement may at least partially enclose the field electrode. The field electrode may be arranged between two portions of the counter electrode arrangement when seen in a direction along the beam path of the emitted particles.

The field electrode may be configured as a ring electrode. The ring electrode may be in the shape of a torus or may be substantially in the shape of a torus. An axial length of the field electrode, measured along the axis of the passage opening or along the beam path of the emitted particles, may be within a range of between 0.5 millimeters and 20 millimeters, or within a range of between 0.5 millimeters and 10 millimeters, or within a range of between 0.5 millimeters and 5 millimeters. The passage opening of the field electrode may have a maximum diameter of between 0.2 millimeters and 20 millimeters, or between 0.2 millimeters and 10 millimeters, or between 0.2 millimeters and 5 millimeters.

An axial length of the counter electrode arrangement, measured along an axis of the through-opening or along the beam path of the emitted particles, may be smaller than 50 times, or smaller than 30 times, or smaller than 20 times, or smaller than 10 times, or smaller 5 times the axial length of the field electrode.

The first and/or the second grid electrode portion may include a hole grid and/or a mesh grid, such as a wire mesh grid. Each of the grid electrode portions may include a plurality of grid openings. An area percentage of the grid openings of the grid electrode portions may be greater than 50% or greater than 70%, or greater than 80%, or greater than 90% of the entire surface of the grid electrode portions. The grid electrode portions may be transmissive for the majority of the emitted particles, which are incident on the grid electrode portions.

A maximum diameter of all grid openings may be smaller than 20 millimeters, or smaller than 10 millimeters, or smaller than 5 millimeters, or smaller than 3 millimeters, or smaller than 2 millimeters, or smaller than 1 millimeter, or smaller than 0.5 millimeters.

The field electrode may be gridless. The field electrode may have one single passage opening.

A potential of the first grid electrode portion may be equal to, or adjusted to a potential of the second grid electrode portion. The potential of the first and/or the second grid electrode portion may be adjusted to a surrounding potential or to a potential of a liner tube of the particle optical system. The surrounding potential may be a potential of neighboring components in a surrounding region of the counter electrode arrangement.

Each of the field electrode and/or the counter electrode arrangement may have a substantially rotationally symmetric form or may have a rotationally symmetric form. The symmetry axis of the field electrode and/or the symmetry axis of the counter electrode arrangement may be aligned on the axis of the primary beam.

According to a further embodiment, in a cross-section of the particle optical detector component taken in a plane extending from a center of the passage opening and being oriented obliquely and/or perpendicular to a circumferential direction of the passage opening, at least a portion of the first gird electrode portion and/or at least a portion of the second grid electrode portion is concave and/or convex toward the field electrode.

A maximum radius of curvature of the convex and/or concave portions of the first and/or the second grid electrode portions may be smaller than three times the diameter of the passage opening of the field electrode, or smaller than two times the diameter of the passage opening or smaller than the diameter of the passage opening. The beam path of the emitted particles may traverse at least a portion of the convex and/or concave portion.

According to a further embodiment, an inner diameter of the passage opening is greater than an axial length of the passage opening.

According to a further embodiment, the inner diameter of the passage opening is greater than two times or greater than three times or greater than 5 times or greater than 10 times the axial length of the passage opening. The inner diameter may be the smallest inner diameter of the passage opening and/or may extend obliquely to an axial direction of the passage opening. The axial length may be the longest extension of the passage opening along the axial direction.

The inner diameter of the passage opening of the field electrode may be at least 3 times, at least 5 times or at least 10 times or at least 20 times, or at least 50 times of a maximum diameter of a grid opening of the first and/or second grid electrode portion. A portion of the emitted particles may pass through the grid opening.

According to a further embodiment, the particle optical detector component is configured to generate a second electrostatic field in the beam path of the emitted particles. The particle optical detector component may comprises a second field electrode and a second counter electrode arrangement, wherein the second field is generated between the second field electrode and the second counter electrode arrangement. The second field electrode may comprise a passage opening through which the emitted particles pass.

The second counter electrode arrangement may include a first grid electrode portion through which the emitted particles enter into the second field and a second grid electrode portion through which the emitted particles exit from the second field.

Thereby it is possible to provide a more efficient energy filtering of the emitted particles.

The first field may be configured to have a converging or diverging particle optical effect on the emitted particles which enter into the first field. The second field may be configured to have a converging or diverging particle optical effect on the emitted particles, which enter into the second field. The first field may be located in the beam path of the emitted particles upstream or downstream of the second field. The first field may be configured to overlap or may be configured not to overlap the second field.

The potential of the first counter electrode arrangement may be different or may be adjusted to the potential of the second counter electrode arrangement. The potential of the first field electrode may be different or adjusted to the potential of the second field electrode. The sign of the potential of the first field electrode relative to the potential of the first and/or second counter electrode arrangement may be different to the sign of the potential of the second field electrode relative to the potential of the first and/or second counter electrode arrangement.

According to a further embodiment, the field at least partially surrounds an axis of the primary beam and/or the field is substantially rotationally symmetric and/or substantially axially symmetric. The substantially rotationally symmetric or axially symmetric field may define a particle optical axis of the particle optical detector component.

According to a further embodiment, the field is configured such that for emitted particles of a same kinetic incidence energy, a deflection angle increases with an increasing radial distance of incidence from a straight line. The straight line may be the particle optical axis of the particle optical detector component and/or the particle optical axis of the particle optical system. The kinetic incidence energy may be measured at a location at which the emitted particle enters into the field.

The dependency of the deflection angle on the radial distance of incidence may be measured from particles having a common direction of incidence. The common direction of incidence may be substantially parallel to the particle optical axis of the particle optical component and/or substantially parallel to the particle optical axis of the particle optical system.

The deflection angle of an emitted particle may be defined as an angle formed between a direction of incidence of the emitted particle and a direction of exit of the emitted particle. The direction of incidence, the kinetic energy and/or the radial distance of incidence may be measured at a location, at which the emitted particle enters into the field. The direction of exit may be measured at a location, at which the emitted particle exits from the field.

Angles between directions of incidence of the emitted particles may be smaller than 20 degrees, smaller than 10 degrees or smaller than 5 degrees or smaller than three degrees or smaller than 1 degree or smaller than 0.5 degree. When the emitted particles are incident on the particle optical detector component, the beam path of the emitted particles may be parallel or substantially parallel. In other words, the directions of incidence of the emitted particles may be parallel or substantially parallel. Alternatively, the beam path of the emitted particles, when being incident on the particle optical detector component may be converging or diverging.

According to a further embodiment, the scanning particle beam microscope is configured such that angles between the directions of incidence of the emitted particles on the one hand and the straight line, the particle optical axis of the particle optical detector component, and/or the particle optical axis of the particle optical system on the other hand are smaller than 10 degrees, or smaller than 5 degrees, or smaller than three degrees or smaller than 1 degree, or smaller than 0.5 degree.

According to a further embodiment, the field is configured such that for emitted particles of a same kinetic incidence energy, a dependency of a deflection angle on a radial distance of incidence relative to a straight line is adapted to a linearly increasing dependency.

The linear dependency may pass through the origin point. In other words, the linear dependency may have a deflection angle of zero at a radial distance of incidence of zero.

According to a further embodiment, for all emitted particles of a same kinetic incident energy, a deviation of the deflection angle from the linearly increasing dependency is less than 30% of the deflection angle, or less than 20%, or less than 10%, or less than 5% of the deflection angle.

According to a further embodiment, the straight line is aligned on an axis of the primary beam, aligned on a particle optical axis of the particle optical system, and/or aligned on a particle optical axis of the particle optical component.

The straight line may be aligned such that an angle formed between the straight line on the one hand and the axis of the primary beam, the axis of the particle optical system, and/or the axis of the particle optical component on the other hand is smaller than 10 degrees, or smaller than 5 degrees, or smaller than three degrees or smaller than 1 degree, or smaller than 0.5 degree.

According to a further embodiment, the particle optical detector component generates an energy-dependent shift of a focus region of the particle beam path in a direction along the particle beam path. Additionally or alternatively, the particle optical detector component may generate an energy-dependent shift of a region of divergence of the beam path in a direction along the beam path. The region of divergence may be a virtual region of divergence. The region of divergence may be determined by an backward extension of the trajectories of the emitted particles.

The particle optical detector component may be configured such that two different energy ranges of the kinetic energy of the emitted particles have two different focus regions, which are shifted relative to each other in a direction along the beam path of the emitted particles. The shift may be configured such that the spatial filtering suppresses a detection of the emitted particles of the first focus region relative to a detection of the emitted particles of the second focus region. The two energy ranges may be complementary and/or non-overlapping energy ranges of the energy distribution.

The shift of the two focus regions relative to each other may generate, for the emitted particles of the first energy range, a degree of focus and/or an intensity profile on the spatial filter, which is different from a degree of focus and/or an intensity profile of the emitted particles of the second energy range. Thereby, an energy filtering according to the kinetic energy is performed by the spatial filtering.

Alternatively, the particle optical detector component may be configured such that two different energy ranges of the kinetic energy of the emitted particles have two different regions of divergence, which are shifted relatively to each other in a direction along the beam path of the emitted particles.

The shift of the two regions of divergence may generate, for the emitted particles of the first energy range, a degree of focus and/or an intensity profile on the spatial filter, which is different from a degree of focus and/or an intensity profile of the emitted particles of the second energy range. Thereby, an energy filtering according to the kinetic energy is performed by the spatial filtering.

According to a further embodiment, the particle optical detector component comprises at least one electrode, which surrounds or at least partially surrounds the primary beam. The field electrode and/or the counter electrode arrangement may be configured to surround or at least partially surround the primary beam.

According to a further embodiment, the particle optical detector component comprises a retarding field electrode arrangement and/or an accelerating field electrode arrangement.

Thereby, a particle optical detector component is provided, wherein the emitted particles may have a smaller kinetic energy when passing through the field, compared to the kinetic energy when the emitted particles are incident on the retarding field electrode arrangement. This allows to obtain greater deflection angles with the same potential difference between the field electrode and the counter electrode arrangement. Thereby it is possible to obtain a more efficient energy filtering.

The retarding field electrode arrangement may be configured to reduce the kinetic energy of the emitted particles. Additionally, the retarding field electrode arrangement may reflect low energy particles, which have a kinetic energy, which is below a pre-determined threshold energy such that these particles do not enter into the field generated by the field electrode and the counter electrode arrangement.

The retarding field electrode arrangement may be disposed in the beam path of the emitted particles upstream of the field electrode and/or the counter electrode arrangement. The accelerating field electrode arrangement may be arranged in the beam path of the emitted particles downstream of the counter electrode arrangement and/or the field electrode.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

FIGS. 4A and 4B schematically illustrate field strength vectors and equipotential lines of the electrostatic field of the particle optical component according to the first exemplary embodiment, which is shown in FIG. 3;

DETAILED DESCRIPTION OF EXEMPLARY EMBODIMENTS

Figure 1:
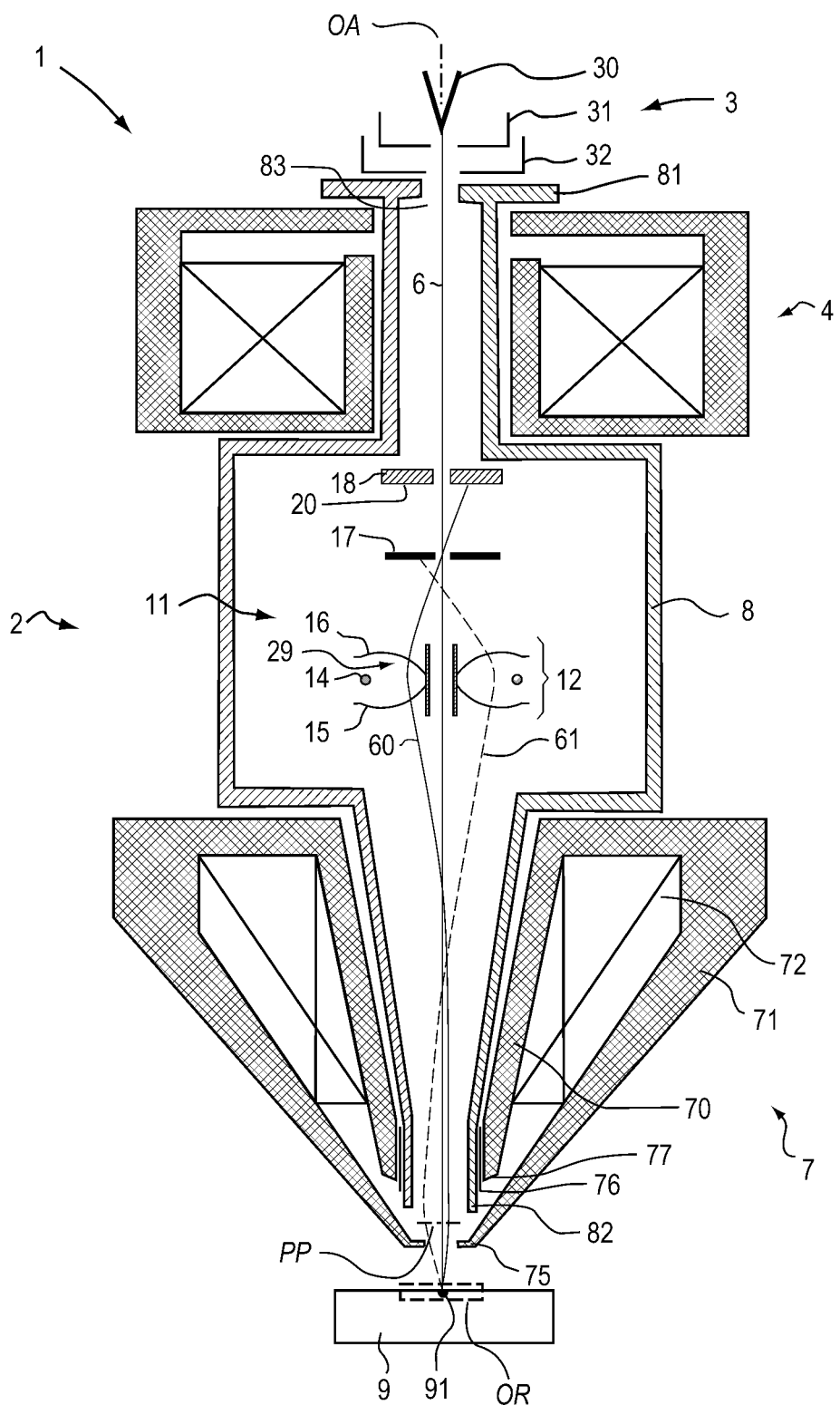
FIG. 1 schematically illustrates a scanning particle beam microscope according to a first exemplary embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 is a schematical representation of a scanning particle beam microscope 1 according to a first exemplary embodiment. The scanning particle microscope 1, which is illustrated in FIG. 1, is a scanning electron microscope. However, it is also conceivable that the scanning particle microscope 1 is a focused ion beam microscope, such as a helium ion microscope. The scanning particle microscope 1 includes a particle optical system 2. The particle optical system 2 includes a particle source 3, a condenser system 4 and an objective lens 7.

The particle source 3 includes a cathode 30. By way of example, the cathode 30 is a Schottky field emitter. The particle source 3 further includes a suppressor electrode 31 and an extraction electrode 32. The primary beam 6 is emitted from the particle source 3 and passes through an anode 81, which accelerates the particles of the primary beam 6. After passing through the anode 81, the primary beam 6 passes through the condenser system 4 and the objective lens 7.

The condenser system 4 is configured as a magnetic condenser system. The objective lens 7 generates an objective lens field, which includes an electric field and magnetic field. The objective lens field is configured to focus the primary beam 6 exiting from the condenser system 4 on an object region OR of the particle optical system 2. The particle optical system 2 further includes a deflection system, which includes two scanning coils 76. The deflection system is configured to scan the primary beam 6 in the object region OR. In order to acquire a microscopic image, the surface of the object 9 is disposed in the object region OR and the primary beam 6 is scanned across the object region OR.

After passing through the anode 81, the primary beam 6 enters into the liner tube 8 of the particle optical system 2. The liner tube 8 is connected to a voltage supply (not shown in FIG. 1) and is placed at a positive potential relative to the cathode 30. Thereby, the particles of the primary beam 6 are guided through at least a portion of the particle optical system 2 with a high kinetic energy, such as in the range of 10 keV. Thereby, it is possible to reduce spherical and chromatic aberrations of the primary beam 6 and/or to reduce the influence of interference fields. The liner tube 8 is also denoted as "beam booster". A source-side end 83 of the liner tube 8 is connected to the anode 81. An axial position of an object-side end 82 of the liner tube 8 is between an axial position of an end portion 75 of an object-side pole piece 71 of the objective lens 7 and an axial position of an end portion 77 of a source-side pole piece 70 of the objective lens 7. The axial positions are measured relative to a particle optical axis OA of the particle optical system 2.

The source-side pole piece 70 and the object-side pole piece 71 are excited by an excitation coil 72 of the objective lens 7 to generate the magnetic field of the objective lens field. The electric field of the objective lens field is formed between the object-side end 82 of the liner tube 8 and the end portion 75 of the object-side pole piece 71. The electrons of the primary beam 6 are decelerated by the electric field of the objective lens field to a landing energy, at which the electrons of the primary beam 6 impinge on the object region OR.

Emitted particles 60, 61 are emitted from an interaction region 91, where the primary beam 6 interacts with the object 9. The emitted particles 60, 61 are guided into the liner tube 8 by the electric field of the objective lens field and are then directed to the detector system 11. The emitted particles 60, 61 pass through a principal plane PP of the objective lens 7. The detector system 11 is disposed within the liner tube 8. The detector system 11 is configured to filter the emitted particles 60, 61 according to their kinetic energy and to detect the filtered portion of the emitted particles.

The detector system 11 includes a particle optical detector component 12, which is arranged in the beam path of the emitted particles upstream of an aperture stop 17 and upstream of the detector 18. The aperture stop 17 acts as a spatial filter. Additionally, also the particle receiving surface 20 may act as a spatial filter for the emitted particles.

Alternatively, the detector system may be configured such that the spatial filtering is performed without using an aperture stop. By way of example, the spatial filtering may be performed exclusively by the particle receiving surface 20. Thereby it is possible that the detector system is configured without an aperture stop, or that an aperture stop of the detector system is without effect on the spatial filtering.

Alternatively, the detector system may include a detector, having a passage opening for allowing passage of at least a portion of the emitted particles. Thereby, the detector may act as an aperture stop. The passage opening may be configured such that the primary beam 6 passes through the passage opening.

The particle optical detector component 12 is configured such that the spatial filtering filters the emitted particles according to their kinetic energy. By the energy filtering, the detection of emitted particles having a kinetic energy outside of a pre-determined energy range, is suppressed compared to particles having a kinetic energy within the pre-determined energy range.

Figure 2:
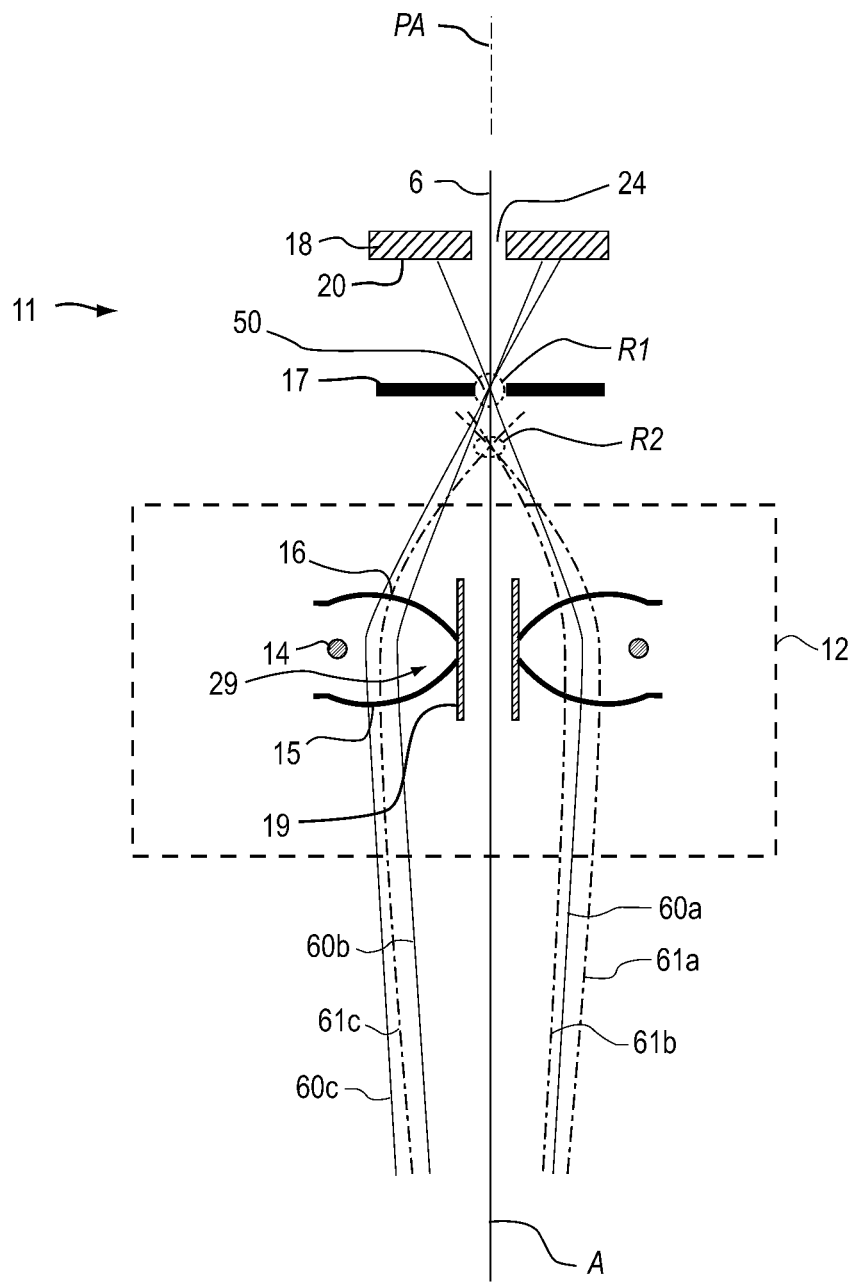
FIG. 2 schematically illustrates a detector system of the scanning particle beam microscope according to the first exemplary embodiment, which is shown in FIG. 1.

The configuration of the detector system 11 of the particle beam microscope, shown in FIG. 1, is schematically illustrated in FIG. 2.

The particle optical detector component 12 is configured to generate an energy-dependent focus shift of the emitted particles 60a, 60b, 60c, 61a, 61b, 61c in a direction along the beam path of the emitted particles. As a result of the energy-dependent focus shift, the emitted particles of a first kinetic energy 60a, 60b, 60c are concentrated in a first focus region R1 and emitted particle of a second kinetic energy 61a, 61b, 61c are concentrated in a second focus region R2. The first and the second focus regions R1, R2 are located along the beam path of the emitted particles 60a, 60b, 60c, 61a, 61b, 61c and are displaced relative to each other. Hence, the particle optical detector component 12 generates an energy-dependent focus shift along the beam path of the emitted particles. The first focus region R1 is at least partially located in or located close to the aperture 50 of the aperture stop 17 such that a major portion of the emitted particles of the first kinetic energy 60a, 60b, 60c are incident on the particle receiving surface 20 of the detector 18. The second focus region R2 is located in the beam path of the emitted particles upstream of the aperture stop 17, such that the emitted particles of the second kinetic energy 61a, 61b, 61c are strongly defocused in the plane of the aperture stop 17. Thereby, a detection of the emitted particles of the second kinetic energy 61a, 61b, 61c is suppressed.

The particle optical detector component 12 is configured to generate an electrostatic field. The field is generated between a field electrode 14 and a counter electrode arrangement 29. The counter electrode arrangement 29 at least partially encloses the field electrode 14. The counter electrode arrangement 29 includes a first grid electrode portion 15 and a second grid electrode portion 16. The emitted particles enter the field through the first grid electrode portion 15 and exit the field through the second grid electrode portion 16.

The field electrode 14 and/or the counter electrode arrangement 29 have a substantially rotationally symmetric form or have a rotationally symmetric form. A common rotation axis of the rotationally symmetric form of the field electrode and the rotationally symmetric form of the counter electrode arrangement forms a particle optical axis A of the particle optical detector component 12. The particle optical axis A of the particle optical detector component 12 is aligned on an axis PA of the primary beam 6. The primary beam 6 passes through the aperture 50 and through the passage opening 24 of the detector.

The particle optical detector component 12 includes a shielding tube 19, through which the primary beam 6 passes. The shielding tube 19 shields the primary beam 6 from interference fields generated by the particle optical detector component 12. A portion of the shielding tube 19 forms part of the counter electrode arrangement 29. The potential of the counter electrode arrangement 29 is adjusted to a potential of the shielding tube 19. Both of these potentials are in turn adjusted to the potential of the liner tube 8 (shown in FIG. 8). The field electrode 14 is placed at a negative potential relative to the counter electrode arrangement 29. As described further below, it is also conceivable that the field electrode 14 is placed at a positive potential relative to the counter electrode arrangement 29.

Figure 3:
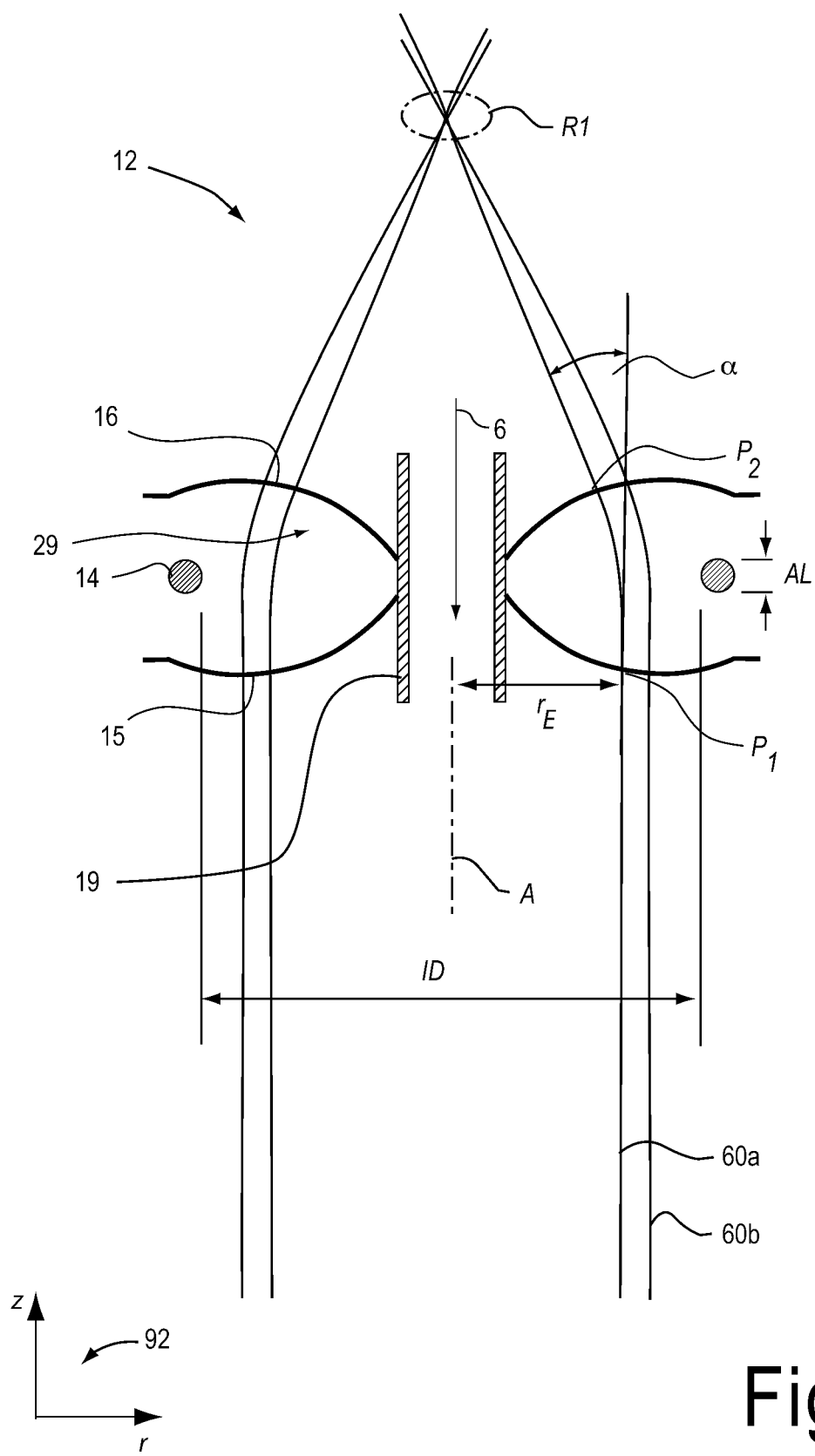
FIG. 3 schematically illustrates a particle optical detector component of the detector system according to the first exemplary embodiment, which is shown in FIG. 2.

Geometric characteristics of the particle optical detector component 12 are discussed with reference to FIG. 3. The field electrode 14 includes a passage opening configured to allow passage of the emitted particles. The passage opening has an inner diameter ID. The inner diameter ID is larger than an axial length AL of the field electrode 14. The field electrode 14 is configured as a ring electrode and is in the shape of a torus.

When the emitted particles are incident on the particle optical detector component, the emitted particles have a direction of incidence, which forms an angle with the particle optical axis A of the particle optical detector component 12. This angle is smaller than 20 degrees, or smaller than 10 degrees, or smaller than 5 degrees, or smaller than 3 degrees, or smaller than 1 degree, or smaller than 0.5 degree.

The field is configured such, that for emitted particles 60a, 60b of a same kinetic energy, a deflection angle α increases with increasing radial distance of incidence $r_E$ relative to the particle optical axis A of the particle optical detector component 12. Thereby, the emitted particles are concentrated in a focus region R1. The radial distance of incidence $r_E$ is measured at a location $P_1$, at which the emitted particles enter into the field.

FIGS. 4A and 4B show cross-sections of the particle optical detector component. The cross sections extend from a center of the passage opening of the field electrode 14 and are oriented perpendicular to a circumferential direction of the passage opening. FIGS. 4A and 4b illustrate different geometric configurations of the field electrode 14 and the counter electrode arrangement 29.

In this cross-section, the field electrode 14 has the form of a circle. The circle may have a diameter in a range of between 1 millimeters and 10 millimeters. Further, in these cross sections, a portion of the first and the second grid electrode portions 15, 16 are concave toward the field electrode 14. The concave form allows to efficiently concentrate the emitted particles within the focus region R1.

FIG. 4A illustrates field strength vectors of the field and FIG. 4B illustrates equipotential lines of the field. All components of the counter electrode arrangement 29 are conductive and are electrically connected to each other. Thereby, neglecting small fluctuations caused by the openings in the grid electrode portions 15, 16, the concave surfaces formed by the counter electrode arrangement 29 forms an equipotential surface.

In the cross section perpendicular to the circumferential direction, a surface of the field electrode 14, which faces the beam path of the emitted particles, has a greater curvature than the concave formed portions of the first and the second grid electrode portions 15, 16. Thereby, at this surface of the field electrode 14, higher field strengths occur than at the concave formed portions of the counter electrode arrangement 29.

The sinus of the deflection angle $\alpha$ of an emitted particle (shown in FIG. 3) is approximately proportional to an integral of the radial component of the electrical field along the trajectory of the emitted particles divided by the kinetic energy evaluated along the trajectory:

$$\sin(\alpha(r_E)) \propto \int \frac{E_r(r, z)}{E_{kin}(r, z)} d\vec{x} \qquad (1)$$

wherein $E_r(r, z)$ is the radial component of the electrostatic field at coordinates r and z in a cylindrical coordinate system 92 relative to the particle optical axis A of a particle optical system. $E_{kin}(r, z)$ denotes the kinetic energy of the emitted particle at the coordinates r and z. $\alpha(r_E)$ denotes the deflection angle measured after the emitted particle has exited from the field. The deflection angle $\alpha(r_E)$ depends on the radial distance of incidence $r_E$ of the particle.

For a particle optical detector component, in which the kinetic energy $E_{kin}$ of the particle within the field remains approximately constant, the dependency between the sinus of the deflection angle $\alpha$, the kinetic energy $E_{kin}$ and the radial component of the electrical field $E_r$ can approximately be expressed by:

$$\sin(\alpha(r_E)) \propto \frac{1}{E_{kin}} \int E_r(r, z) d\vec{x} \qquad (2)$$

Figure 5A:
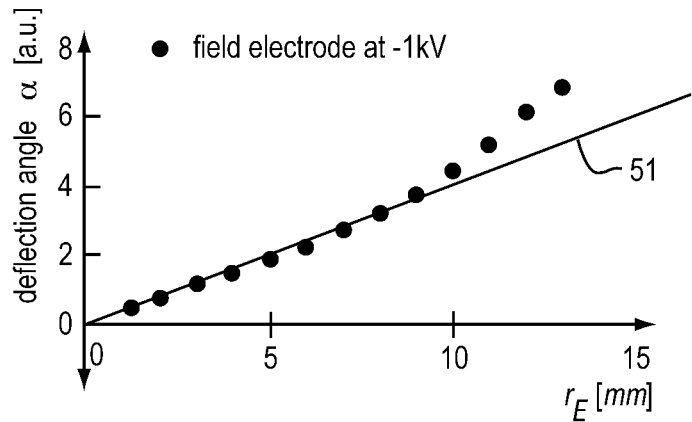
FIGS. 5A and 5B schematically illustrate the particle optical detector component according to the first exemplary embodiment when configured to have a converging particle optical effect.
Figure 5B:
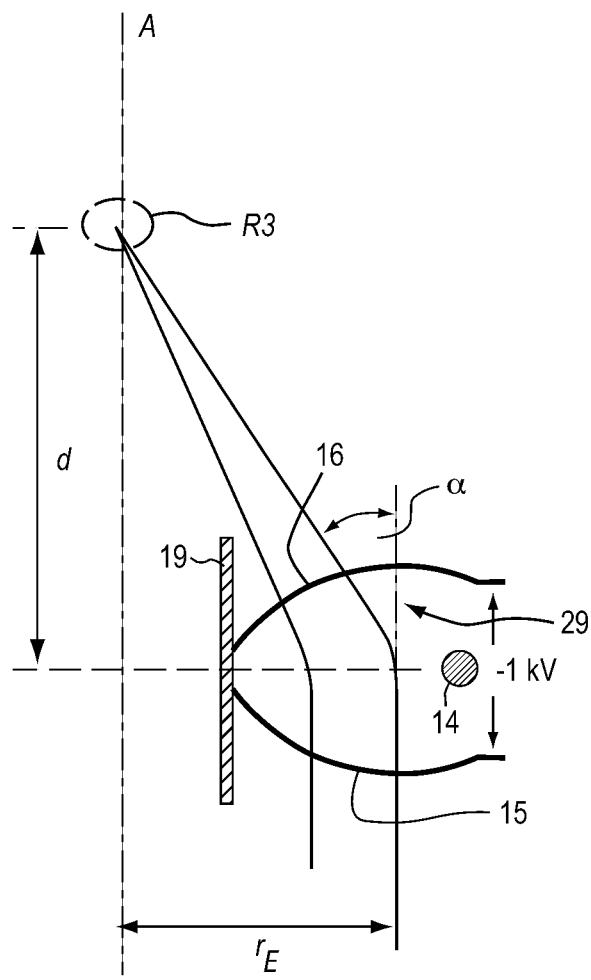

In FIG. 5A, data points are shown which represent the dependency between the deflection angle $\alpha$ and the radial distance of incidence $r_E$ for particles having a same kinetic energy of incidence. For these data points, the field electrode 14 is placed at a negative potential relative to the counter electrode arrangement 29, as is illustrated in FIG. 5B.

As can be seen from the data points which are shown in FIG. 5A, the dependency of the deflection angle $\alpha$ on the radial distance of incidence $r_E$ for particles of a same kinetic energy of incidence, is adjusted to a linear increasing dependency which passes the origin point. The linear increasing dependency is illustrated in FIG. 5A as a straight line 51. For each deflection angle, a deviation from the linear increasing dependency is smaller than 30% of the respective deflection angle, or smaller than 20%, or smaller than 10%, or smaller than 5% of the respective deflection angle.

The particle optical detector component acts as a converging lens, which converges emitted particles of a same kinetic energy toward a focus region R3. The small extent of the focus region R3 results from the adaptation of the dependency of the deflection angle $\alpha$ on the radial distance of incidence $r_E$ to a linear dependency. The dependency of the distance d, measured between the focus region R3 and the field electrode 14, on the deflection angle $\alpha$ and on the radial distance of incidence $r_E$ can be approximately express by:

$$d \approx \frac{r_E}{\sin\alpha}. \qquad (3)$$

The distance d depends on the potential of the field electrode 14. At a kinetic incidence energy of 8 keV and a potential of the field electrode of –4 keV relative to the counter electrode arrangement 29, the distance d amounts to about 5 centimeters.

By using equations (1) and (3), the dependency of the distance d on the kinetic energy can be expressed by the following equation:

$$d \propto \frac{r_E}{\int E_r(r, z) / E_{kin}(r, z) d\vec{x}} \qquad (4)$$

The energy-dependent focus shift along the beam path of the emitted particles occurs as a result of the energy dependence of the distance d. Hence, the emitted particles can be filtered according to their kinetic energy by arranging the spatial filter accordingly.

Figure 5C:
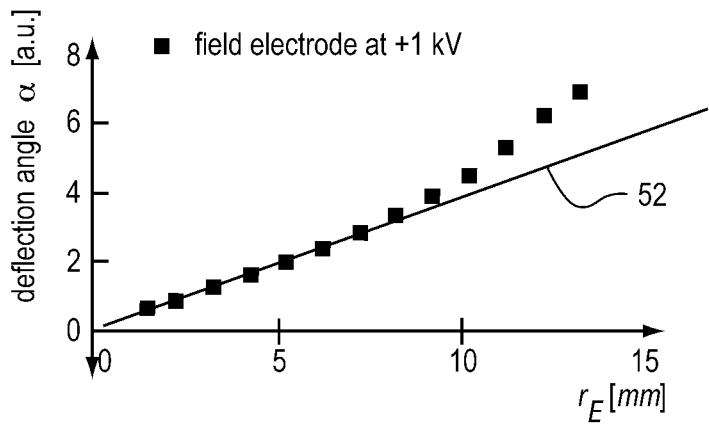
FIGS. 5C and 5D schematically illustrate the particle optical detector component according to the first exemplary embodiment when configured to have a diverging particle optical effect.
Figure 5D:
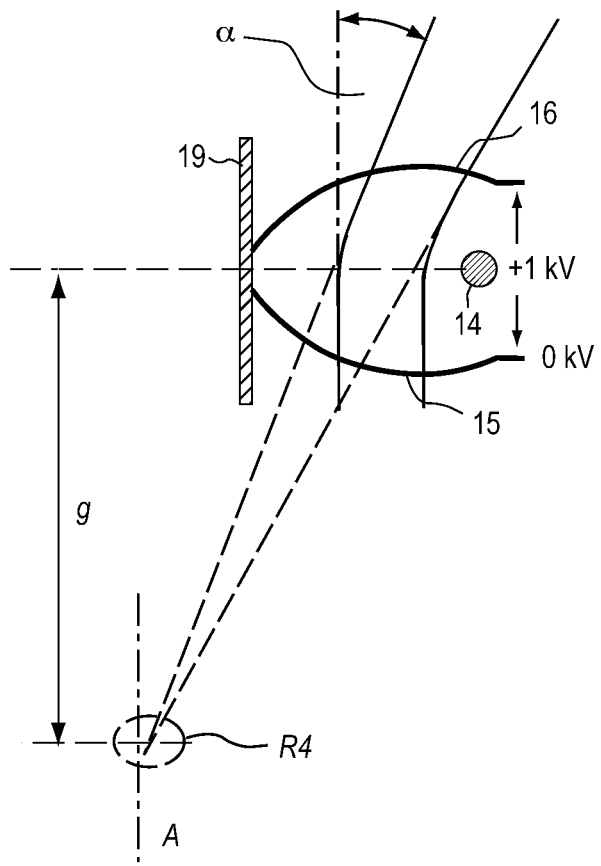

The particle optical detector component, which is illustrated FIGS. 5A and 5B and the particle optical detector component, which is illustrated in FIGS. 5C and 5D have an identical geometric configuration. However, in FIGS. 5C and 5D, the field electrode 14 is placed at a positive potential relative to the counter electrode arrangement 29. Thereby, the particle optical detector component has a diverging particle optical effect.

As shown in FIG. 5C, also in this case, the dependency of the deflection angle on the radial distance of incidence $r_E$ for emitted particles of a same kinetic energy of incidence is adapted to a linearly increasing dependency, which passes through the origin point. In FIG. 5C, the linearly increasing dependency is illustrated as a straight line 52. For each deflection angle, a deviation from the linearly increasing dependency is smaller than 30% of the respective deflection angle, or smaller than 20%, or smaller than 10%, or smaller than 5% of the respective deflection angle.

Backward extensions of the trajectories of particles of a same kinetic energy form a common region of divergence R4, located at a distance g from the field electrode 14. Thereby, the region of divergence 14 represents a virtual region of divergence.

Equation (4) can be used for determining the distance g of the region of divergence R4 from the field electrode 14 in an analog way. Hence, also the distance g depends on the kinetic energy of the emitted particles. Therefore, the field generates an energy-dependent shift of the region of divergence R4 along the beam path of the emitted particles. As a result of the energy-dependent shift of the region of divergence R4, electrons can for example be differently defocused on a particle receiving surface of a detector, depending on the kinetic energy of the emitted particles. By way of example, electrons of a low kinetic energy may be deflected such that they do not impinge on the particle receiving surface of the detector. Hence, it is possible to carry out a filtering according to the kinetic energy of the electrons.

Figure 6:
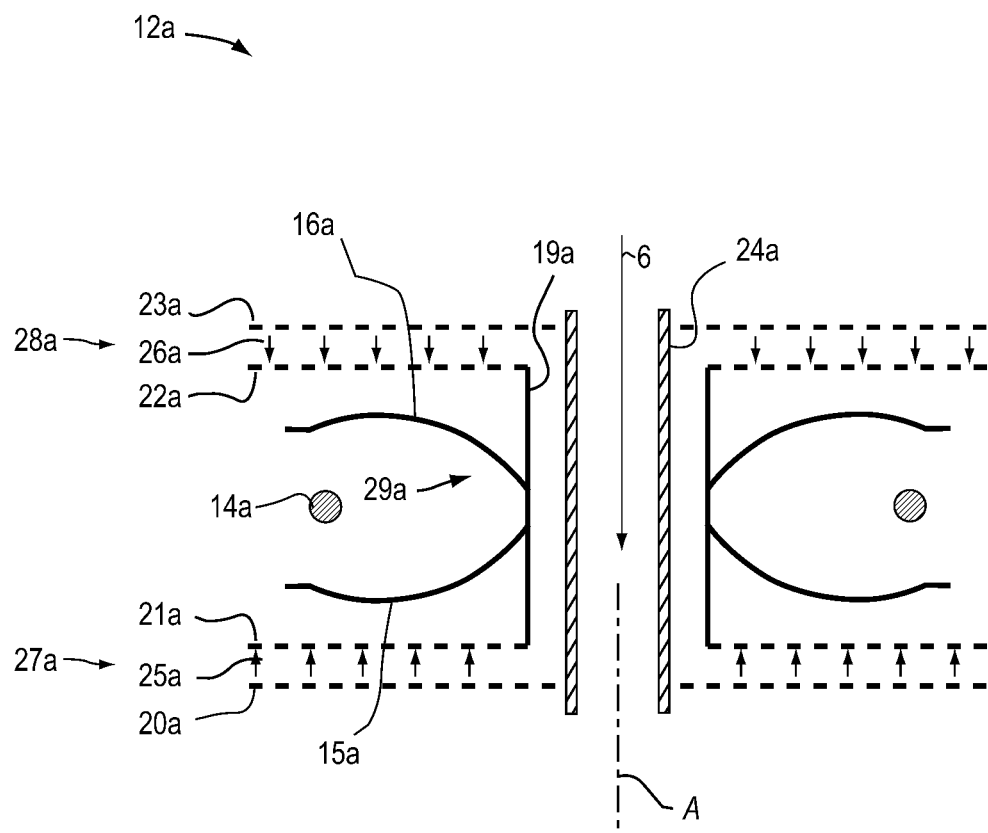
FIG. 6 schematically illustrates a particle optical detector component according to a second exemplary embodiment.

FIG. 6 shows a particle optical detector component 12a of a detector system according to a second exemplary embodiment. Components, which correspond to components of the first exemplary embodiment shown in FIGS. 1 to 5D with regard to their composition, their structure and/or function are designated with the same reference numerals, wherein the letter "a" is added to indicate differentiation.

The particle optical detector component 12a includes a retarding field electrode arrangement 27a and an accelerating field electron arrangement 28a. The retarding field electrode arrangement 27a is configured to reduce the kinetic energy of the emitted particles before entering into the field, which is generated by the field electrode 14a and the counter electrode arrangement 29a. The accelerating field electron arrangement 28a is configured to increase the kinetic energy of the emitted particles after having exited from the field, which is generated by the field electrode 14a and the counter electrode arrangement 29a.

The retarding field electrode arrangement 27a is disposed in the beam path of the emitted particles upstream of the field electrode 14a and upstream of the counter electrode arrangement 29a. The accelerating field electron arrangement 28a is disposed in the beam path of the emitted particles downstream of the field electrode 14a and downstream of the counter electrode arrangement 29a. In FIG. 6, the field lines of the retarding field 25a and the accelerating field 26a are schematically indicated. Each of the accelerating field 26a and the retarding field 25a are homogeneous or substantially homogeneous.

In the second exemplary embodiment, which is shown in FIG. 6, the retarding field electrode arrangement 27a has an object-side grid electrode 20a and a detector-side grid electrode 21a, each of which being connected to a voltage source (not shown). The object-side grid electrode 20a is placed at the potential of the liner tube 8 (shown in FIG. 1). The detector-side grid electrode 21a is placed at the potential of the counter electrode arrangement 29a.

In a similar manner, the accelerating field electron arrangement 28a includes an object-side grid electrode 22a and a detector-side grid electrode 23a, each of which being connected to a voltage source (not shown). The object-side grid electrode 22a is placed at the potential of the counter electrode arrangement 29a. The detector-side grid electrode 23a is placed at the potential of the liner tube 8.

The potential difference between the grid electrodes 20a, 21a of the retarding field electrode arrangement 27a and between the grid electrodes 22a, 23a of the accelerating field electron arrangement 28a may be, for example, set to 4 kV.

The potential of the counter electrode arrangement 29a is different from the potential of the liner tube 8. For this reason, a second shielding tube 24a is disposed inside of the shielding tube 19a, which is configured to allow passage of the primary beam 6. The second shielding tube 24a is placed at the potential of the liner tube. Thereby, it is possible to prevent deflection of the primary beam 6.

The retarding field electrode arrangement 27a allows to reduce the kinetic energy of the emitted particles when the emitted particles pass through the field, which is generated by the field electrode 14a and the counter electrode arrangement 29a. In accordance with equation (4), this allows to vary the difference between two focus regions. Thereby, a more efficient energy filtering can be obtained.

By additionally varying the potential difference between the field electrode 14a and the counter electrode arrangement 29a, it is for example possible to keep the distance of a focus region of a first kinetic energy substantially constant and to vary a distance of a focus region of a second, higher, kinetic energy. This allows to vary the filtered energy range in a flexible manner.

Figure 7:
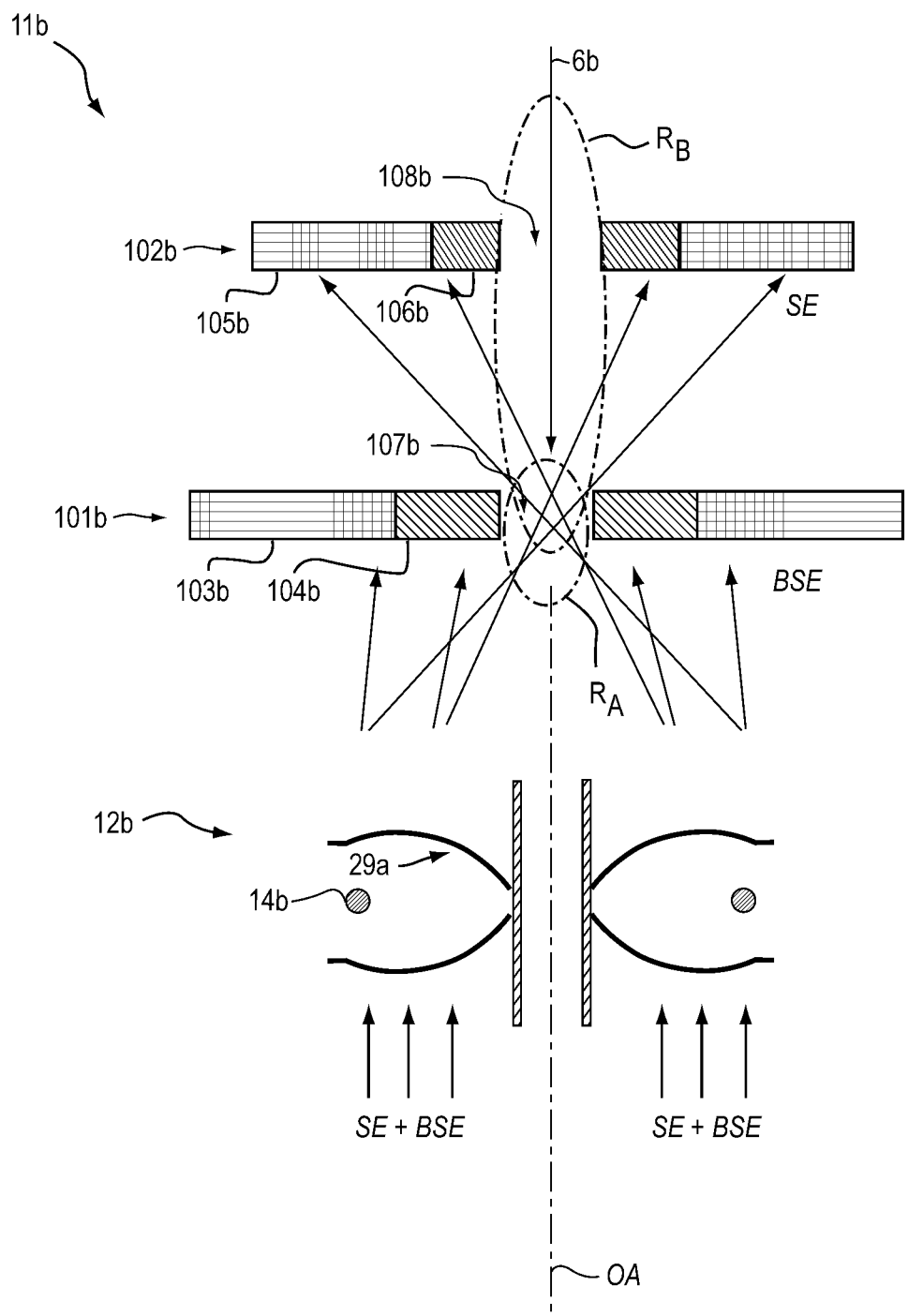
FIG. 7 schematically illustrates a detector system according to a third exemplary embodiment.

FIG. 7 shows a detector system 11b according to a third exemplary embodiment. Components, which correspond to components of the first and second exemplary embodiments shown in FIGS. 1 to 6 with regard to their composition, their structure and/or function are designated with the same reference numerals, wherein the letter "b" is added to indicate differentiation.

The detector system 11b includes a first detector component 101b and a second detector component 102b. The second detector component 102b is disposed downstream of the first detector component 101b. Each of the first and the second detector components 101b, 102b includes a passage opening 107b, 108b for allowing passage of the primary beam 6b.

The detector system 11b is configured such that a major portion of the emitted particles, which are detected by the first detector component 101b, are backscattered electrons and a major portion of the emitted particles, which are detected by the second detector component 102b, are secondary electrons.

As a result of the interaction of the primary beam 6b with the object, secondary electrons and backscattered electrons are emitted from the interaction region. A major portion of the secondary electrons has an emission energy of up to 50 eV. A major portion of the backscattered electrons has an emission energy of between 50 eV and the landing energy of the primary electrons on the object. The liner tube 8 (shown in FIG. 1) is placed at a positive potential relative to the object. Thereby, the emitted electrons are guided into the liner tube and are provided with an additional energy, which corresponds to the potential difference between the liner tube and the object. By way of example, the liner tube is placed at a potential of 8 kV relative to the object. Then, when arriving at the particle detector component 12b, a major portion of secondary electrons has a kinetic incidence energy of between 8 keV to 8.05 keV and a major portion of the backscattered electrons has a kinetic incidence energy of 8.05 keV to 8 keV+$E_a$, wherein $E_a$ is the landing energy of the primary electrons on the object.

The particle optical detector component 12b is configured such that it has a converging particle optical effect. To this end, the field electrode 14b is placed at a negative potential relative to the counter electrode arrangement 29b. The first detector component 101b is arranged relative to the particle optical detector component 12b such that the focus region $R_a$ of emitted electrons, which are emitted from the object surface with an emission energy of up to 50 eV, is located at least partially in or close to the opening 107b. Hence, in the plane of the first detector component 101b, the beam of electrons having an emission energy of up to 50 eV has such an intensity profile that it is strongly focused. Thereby, a major portion of these electrons passes the opening 107b and is incident on one of the particle receiving surfaces 105b, 106b of the second detector component 102b.

The focus region $R_b$ of electrons having an emission energy greater than 50 eV is located downstream of the opening 107b. In the plane of the first detector component

101*b*, the beam of electrons having an emission energy greater than 50 eV has such an intensity profile that it is strongly defocused. Thereby, a major portion of these electrons is incident on one of the particle receiving surfaces 103*b*, 104*b* of the first detector component 101*b*.

Each of the first and the second detector components 101*b*, 102*b* includes a plurality of detectors, each of which having a particle receiving surface. Each of the detectors is configured to separately detect particles, which are incident on the respective detector.

A particle receiving surface may be for example a sensitive surface or a combination of sensitive surfaces of a semiconductor detector, a multichannel plate and/or a scintillator detector.

The first particle receiving surface 106*b* of the second detector component 102*b* is arranged annularly about the particle optical axis OA of the particle optical system.

The first particle receiving surface 106*b* of the second detector component 102*b* predominantly detects secondary electrons, which are emitted from the surface with a comparatively small emission angle and/or with a comparatively high emission energy. The emission angle of an emitted particle may be defined as the angle between the emission direction of the emitted particle and the particle optical axis OA of the particle optical system. Secondary electrons having a small emission angle have a trajectory, which has a small radial distance from the particle optical axis OA of the particle optical system.

The particle intensity of secondary electrons, which are emitted with a small emission angle depends comparatively strongly on the atomic number of the atoms in the interaction region. Hence, depending on the particle intensity of the first particle receiving surface 106*b*, an image showing compositional contrast (i.e. atomic number contrast) can be generated.

The second detector component 102*b* further includes a plurality of sector particle receiving surfaces 105*b*, each of which having the form of a ring sector. The sector particle receiving surfaces 105*b* are arranged circumferentially about the particle optical axis OA of the particle optical system. The sector particle receiving surfaces 105*b* are arranged relative to the particle optical axis OA of the particle optical system at a greater radial distance than the first particle receiving surface 106*b*.

Hence, the sector particle receiving surfaces 105*b* predominantly detect secondary electrons, which are emitted at a large emission angle and/or with a small emission energy. Furthermore, also the portion in the particle intensities of the sector particle receiving surfaces 105*b*, which is generated by backscattered electrons, is smaller than in the particle intensity of the first particle receiving surface 106*b*.

The sector particle receiving surfaces 105*b* separately detect the secondary electron emission in different solid angle regions. The solid angle regions are arranged about the particle optical axis OA of the particle optical system and collect electrons, which have a comparatively great emission angle.

The particle intensities detected by the individual sector particle receiving surfaces 105*a* therefore depend in a comparatively strong manner on the topography of the object surface. Thereby, it is possible to generate an image of the object surface showing topographic contrast, depending on the particle intensities of the sector particle receiving surfaces 105*b* of the second detector component 102*b*.

The first detector component comprises a first particle receiving surface 104*b* and a second particle receiving surface 103*b*, each of which having the form of a ring and surrounding the particle optical axis OA of the particle optical system. The second particle receiving surface 103*b* has, relative to the particle optical axis OA of the particle optical system, a greater radial distance than the first particle receiving surface 104*b*.

On the second particle receiving surface 103*b*, a smaller portion of secondary electrons impinge than on the first particle receiving surface 104*b*. Hence, depending on an intensity of the second particle receiving surface 103*b*, an image of the object surface can be generated showing compositional contrast.

It is conceivable, that the detector system 11*b* has an aperture stop in place of the first detector component 101*b*, wherein the aperture stop is arranged relative to the particle optical detector system 12*b* such that the focus region Ra for emitted electrons, which leave the object surface with an emission energy of up to 50 eV is at least partially located in or close to the aperture of the aperture stop.

Figure 8:
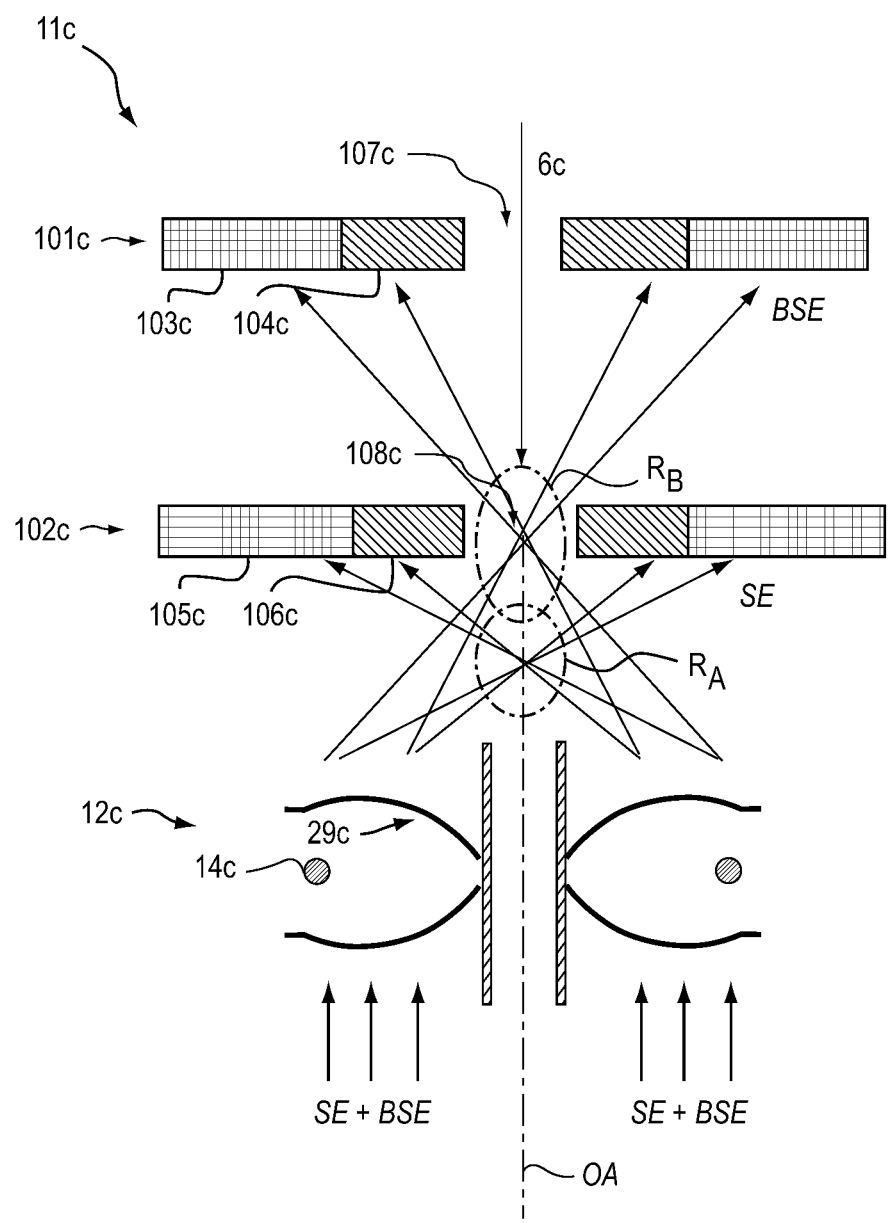
FIG. 8 schematically illustrates a detector system according to a fourth exemplary embodiment.

FIG. 8 shows a fourth exemplary embodiment of a detector system 11*c*. Components, which correspond to components of the first to third exemplary embodiments shown in FIGS. 1 to 7 with regard to their composition, their structure and/or function are designated with the same reference numerals, wherein the letter "c" is added to indicate differentiation.

In contrast to the detector system 11*b* (shown in FIG. 7), in the detector system 11*c* (shown in FIG. 8) of the fourth exemplary embodiment, the first detector component 101*c*, which is configured for detecting backscattered electrons, is arranged downstream relative to the second detector component 102*c*, which is configured for detecting secondary electrons. The configuration of the first detector component 101*c* corresponds to the configuration of the first detector component 101*b* (shown in FIG. 7) of the third exemplary embodiment, wherein, however, the geometry of the particle receiving surfaces are adapted to the different beam paths. This also applies to the second detector component 102*c*.

The detector system 11*c* is configured such that the focus region Rb of the electrons having an emission energy greater than 50 eV is at least partially located in or close to the opening 108*c* of the second detector component 102*c*. Thereby, the electrons, which pass through the opening 108*c* of the second detector component are mostly backscattered electrons. The focus region Ra of the electrons having an emission energy of up to 50 eV is located upstream of the opening 108*c* in the beam path of the emitted particles between the particle optical system 12*c* and the second detector component 102*c*. The secondary electrons are therefore strongly defocused in the plane of the second detector component 102*c* and only a small portion of the secondary electrons pass through the opening 108*c*. The predominant portion of the electrons, which are detected by the second detector component 102*c* are therefore secondary electrons.

The different positions of the focus regions Ra, Rb of the fourth exemplary embodiment (shown in FIG. 8) compared to the third exemplary embodiment (shown in FIG. 7) can in particular be achieved by a stronger negative potential of the field electrode 14*c* relative to the counter field electrode 29*c*. When a particle optical detector component according to second exemplary embodiment (shown in FIG. 6) is used, a variation of the arrangement of the focus regions Ra, Rb along the beam path may also be obtained by a variation of the retarding field and/or the accelerating field.

Figure 9:
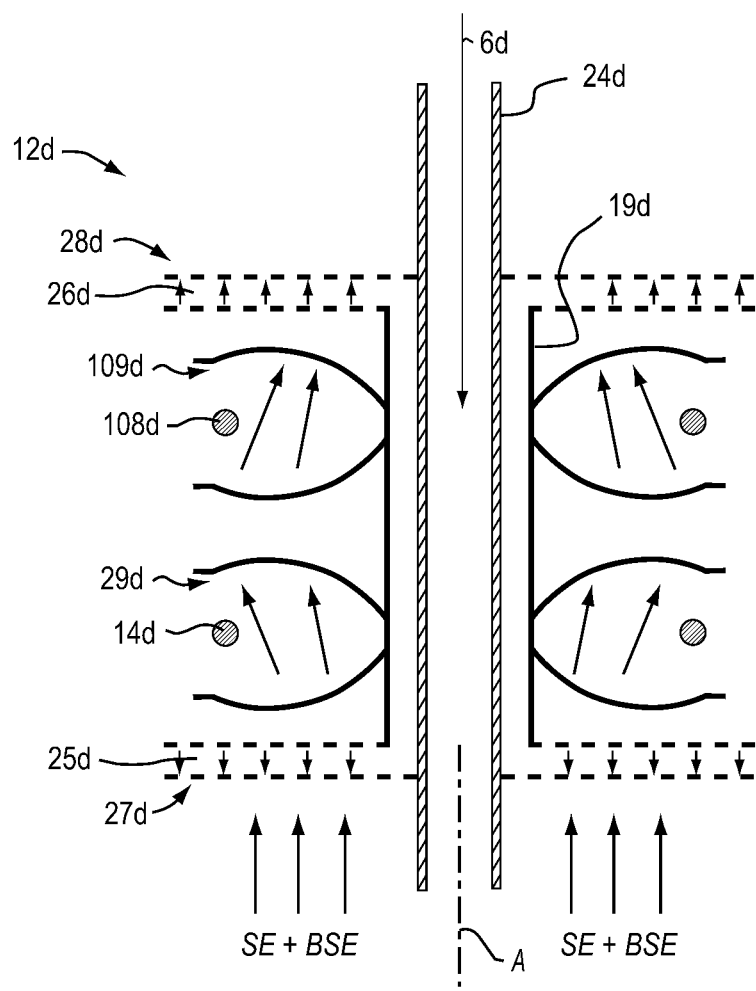
FIG. 9 schematically show a detector system according to a fifth exemplary embodiment.

FIG. 9 shows a particle optical detector component of a detector system according to a fifth exemplary embodiment. Components, which correspond to components of the first to fourth exemplary embodiments shown in FIGS. 1 to 8 with regard to their composition, their structure and/or function are designated with the same reference numerals, wherein the letter "d" is added to indicate differentiation.

The particle optical detector component 12d comprises a second field electrode 108d and a second counter electrode arrangement 109d, for generating a second field.

The retarding field electrode arrangement 27d is arranged in the beam path of the emitted particles upstream of the first and second field electrodes 14d, 108d and the first and the second counter electrode arrangements 29d, 109d. The accelerating field electrode arrangement 28d is arranged in the beam path of the emitted particles upstream of the first and the second field electrodes 14d, 108d and the first and the second counter electrode arrangements 29d, 109d. It is conceivable that the fifth exemplary embodiment is configured without a retarding field electrode arrangement 27d and/or without accelerating field electrode arrangement 28d. The first and the second field electrodes 14d, 108d may have different geometries or the geometries may be adapted to each other. This also applies to the first and the second counter electrode arrangements 29d, 109d.

The detector system of the fifth exemplary embodiment, which is shown in FIG. 9, allows to configure the first and the second fields such that one of the fields has a converging particle optical effect and the other one of the fields has a diverging particle optical effect. In the fifth exemplary embodiment, which is shown in FIG. 9, the first field has a diverging particle optical effect and the second field has a converging particle optical effect.

However, it is also conceivable that both fields have a diverging particle optical effect or that both fields have a converging particle optical effect.

By virtue of the combination of a diverging with a converging particle optical effect, it is possible to vary the energy-depending focus shift. In particular, the combination allows to invert the energy-dependent focus shift. Thereby, it is possible to obtain an energy-depending focus shift, such that the focus region of the emitted particles of higher kinetic energies is located upstream of the focus region of the emitted particles of smaller kinetic energies.

Thereby, it is possible to even better optimize the positions of the focus regions for obtaining a compact detector system and an efficient energy filtering.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

The invention claimed is:

1. A scanning particle beam microscope configured to inspect an object, the scanning particle beam microscope comprising:
   a particle optical system comprising an objective lens configured to focus a primary beam of the microscope on an object region of the particle optical system so that particles are emitted from the object and pass through a principal plane of the objective lens at a location where the principal plane overlaps with an objective lens field of the objective lens; and
   a detector system, comprising:
      a particle optical detector component configured to generate an electrostatic field in a beam path of the emitted particles; and
      a spatial filter,
   wherein:
      the electrostatic field is at least partially arranged outside of an objective lens field of the objective lens;
      the particle optical detector component is configured so that a same electric field strength distribution of the electrostatic field interacts with first and second portions of the emitted particles, having different ranges of kinetic energies, to simultaneously generate:
         a first focused intensity profile of the first portion of the emitted particles across the spatial filter having a first degree of focus; and
         a second focused intensity profile of the second portion of the emitted particles across the spatial filter having a second degree of focus;
      the first degree of focus is different from the second degree of focus; and
      the spatial filter and the particle optical detector component are configured so that the difference between the first degree of focus and the second degree of focus causes a detection of the first portion of the emitted particles by the detection system to be suppressed relative to a detection of the second portion of the emitted particles by the detection system; and
   wherein:
      the particle optical detector component comprises a field electrode and a counter electrode arrangement configured so that the electrostatic field is generated between the field electrode and the counter electrode arrangement;
      the counter electrode arrangement comprises a first grid electrode portion through which the emitted particles enter into the field;
      the counter electrode comprises a second grid electrode portion through which the emitted particles exit from the field;
      the field electrode comprises a passage opening through which the emitted particles pass after the emitted particles enter into the field through the first grid electrode portion and before the emitted particles exit from the field through the second grid electrode portion; and
      in a cross-section of the particle optical detector component taken in a plane extending from a center of the passage opening and oriented perpendicular to a circumferential direction of the passage opening:
         a) at least a portion of the first grid electrode portion is concave toward the field electrode;
         b) at least a portion of the second grid electrode portion is concave toward the field electrode; and
         c) at least the portion of the first grid electrode and at least the portion of the second grid electrode converge toward each other in a direction toward an axis of the passage opening.

2. The scanning particle beam microscope of claim 1, wherein a beam path of the primary particle beam extends outside the field.

3. The scanning particle beam microscope of claim 1, wherein the electrostatic field surrounds the primary beam.

4. The scanning particle beam microscope of claim 1, wherein the particle optical detector component comprises at least one electrode which surrounds the primary beam.

5. The scanning particle beam microscope of claim 1, wherein the spatial filter surrounds the primary beam.

6. The scanning particle beam microscope of claim 1, wherein:
a potential of the first grid electrode portion and a potential of the second grid electrode portion are adjusted to a potential of a liner tube of the particle optical system;
the first and the second grid electrode portions are within the liner tube; and
the liner tube surrounds at least a segment of the primary beam.

7. The scanning particle beam microscope of claim 6, wherein the spatial filter comprises a through-opening.

8. The scanning particle beam microscope of claim 7, wherein the through-opening is configured for a substantial field-free passage of a portion of the emitted particles.

9. The scanning particle beam microscope of claim 7, wherein the through-opening is surrounded by a portion of the spatial filter, which is non-transmissive for the emitted particles, wherein at least a portion of the non-transmissive portion is a particle receiving surface of a detector of the detector system.

10. The scanning particle beam microscope of claim 7, wherein at least a portion of the emitted particles impinge on a particle receiving surface of a detector of the detector system after having passed through the through-opening of the spatial filter.

11. The scanning particle beam microscope of claim 6, wherein the spatial filter surrounds the primary beam.

12. The scanning particle beam microscope of claim 6, wherein the electrostatic field surrounds the primary beam.

13. The scanning particle beam microscope of claim 6, wherein the detector system comprises a detector having one or more particle receiving surfaces which are arranged circumferentially around the primary beam.

14. The scanning particle beam microscope of claim 1, wherein the detector system comprises a detector having one or more particle receiving surfaces which are arranged circumferentially around the primary beam.

15. The scanning particle beam microscope of claim 1, wherein the emitted particles converge after exiting the field.

16. The scanning particle beam microscope of claim 1, wherein the spatial filter and the particle optical component are configured so that the difference between the first degree of focus and the second degree of focus causes the first portion of the emitted particles to be substantially filtered from the emitted particles.

17. The scanning particle beam microscope of claim 1, wherein the first and second focused intensity profiles are substantially in a plane.

18. The scanning particle beam microscope of claim 1, wherein the detector system comprises a detector having a particle receiving surface, and at least one of the following holds: the spatial filter is between the electrostatic field and the particle receiving surface; and the particle receiving surface acts as a spatial filter.

19. The scanning particle beam microscope of claim 1, wherein the spatial filter is in the beam path of the emitted particles downstream of the second grid electrode portion.

20. A scanning particle beam microscope configured to inspect an object, the scanning particle beam microscope comprising:
a particle optical system comprising an objective lens configured to focus a primary beam of the scanning particle beam microscope on an object region of the particle optical system so that particles are emitted from the object; and
a detector system comprising:
a particle optical detector component configured to generate an electrostatic field in a beam path of the emitted particles,
wherein:
the particle optical detector component comprises a field electrode and a counter electrode arrangement configured so that the electrostatic field is generated between the field electrode and the counter electrode arrangement;
the field electrode comprises a passage opening through which the emitted particles pass;
the counter electrode arrangement comprises a first grid electrode portion through which the emitted particles enter into the field;
the counter electrode arrangement comprises a second grid electrode portion through which the emitted particles exit from the field;
the emitted particles pass through the passage opening after having entered the field through the first grid electrode portion and before exiting from the field through the second grid electrode portion; and
in a cross-section of the particle optical detector component taken in a plane extending from a center of the passage opening and oriented perpendicular to a circumferential direction of the passage opening:
a) at least a portion of the first grid electrode portion is concave toward the field electrode;
b) at least a portion of the second grid electrode portion is concave toward the field electrode; and
c) at least the portion of the first grid electrode and at least the portion of the second grid electrode converge toward each other in a direction toward an axis of the passage opening.

21. The scanning particle beam microscope of claim 20, wherein:
the electrostatic field is configured so that, for emitted particles of a same kinetic incidence energy, a deflection angle increases with an increasing radial distance of incidence relative to a straight line; and
for each of the emitted particles, the deflection angle is defined as an angle between a direction of incidence of the emitted particle where the respective emitted particle enters into the field and a direction of exit where the emitted particle exits from the field.

22. The scanning particle beam microscope of claim 21, wherein the straight line is aligned on an axis of the primary beam.

23. The scanning particle beam microscope of claim 21, wherein:
the emitted particles pass through a principal plane of the objective lens at a location where the principal plane overlaps with an objective lens field of the objective lens; and
the electrostatic field is at least partially arranged outside of the objective lens field of the objective lens.

24. The scanning particle beam microscope of claim 21, wherein the scanning particle beam microscope is configured so that the emitted particles pass through the objective lens.

25. The scanning particle beam microscope of claim 20, wherein:
the electrostatic field is configured so that, for emitted particles having the same kinetic incidence energy, a dependency of a deflection angle on a radial distance of incidence relative to a straight line is adapted to a linearly increasing dependency; and for each of the emitted particles, the deflection angle is defined as an angle between a direction of incidence of the emitted particle where the respective emitted particle enters into the field and a direction of exit where the emitted particle exits from the field.

26. The scanning particle beam microscope of claim 25, wherein, for all emitted particles having the same kinetic incident energy, a deviation of the deflection angle from the linearly increasing dependency is less than 30% of the deflection angle.

27. The scanning particle beam microscope of claim 25, wherein:
the emitted particles pass through a principal plane of the objective lens at a location where the principal plane overlaps with an objective lens field of the objective lens; and
the electrostatic field is at least partially arranged outside of the objective lens field of the objective lens.

28. The scanning particle beam microscope of claim 25, wherein the scanning particle beam microscope is configured so that the emitted particles pass through the objective lens.

29. The scanning particle beam microscope of claim 20, wherein the particle optical detector component is configured to generate an energy-dependent shift of a focus region of a particle beam path in a direction along the particle beam path.

30. The scanning particle beam microscope of claim 20, wherein the particle optical detector component is configured to generate an energy-dependent shift of a region of divergence of a particle beam path in a direction along the particle beam path.

31. The scanning particle beam microscope of claim 20, wherein:
the particle optical detector component is configured to generate a second electrostatic field in the beam path of the emitted particles;
the particle optical detector component comprises a second field electrode and a second counter electrode arrangement configured so that the second field is generated between the second field electrode and the second counter electrode arrangement; and
the second field electrode comprises a passage opening through which the emitted particles pass.

32. The scanning particle beam microscope of claim 31, wherein the second counter electrode arrangement comprises:
a first grid electrode portion through which the emitted particles enter into the second field; and
a second grid electrode portion through which the emitted particles exit from the second field.

33. The scanning particle beam microscope of claim 20, wherein the electrostatic field surrounds an axis of the primary beam.

34. The scanning particle beam microscope of claim 20, wherein the electrostatic field is substantially axially symmetric.

35. The scanning particle beam microscope of claim 20, wherein the particle optical detector component comprises at least one electrode which surrounds the primary beam.

36. The particle beam microscope of claim 20, wherein the particle optical detector component comprises at least one of a retarding field electrode arrangement and an accelerating field electrode arrangement.

37. The scanning particle beam microscope of claim 20, wherein:
the concave portion of the first grid electrode has a maximum radius of curvature that is less than three times a diameter of the passage opening; and/or
the concave portion of the second grid electrode has a maximum radius of curvature that is less than three times a diameter of the passage opening.

38. The scanning particle microscope of claim 20, wherein:
the emitted particles pass through a principal plane of the objective lens at a location where the principal plane overlaps with an objective lens field of the objective lens; and
a beam path of the primary particle beam extends outside the electrostatic field.

39. The scanning particle microscope of claim 20, wherein:
the emitted particles pass through a principal plane of the objective lens at a location where the principal plane overlaps with an objective lens field of the objective lens; and
the axis of the passage opening is aligned with an axis of the primary beam.

40. The scanning particle microscope of claim 20, wherein, in the cross-section, a distance between at least the portion of the first grid electrode portion and at least the portion of the second grid electrode portion, measured along a pathway which is parallel to an axis of the passage opening, decreases with decreasing radial distance of the pathway from the axis of the passage opening.

41. A scanning particle beam microscope configured to inspect an object, the scanning particle beam microscope comprising:
a particle optical system comprising an objective lens configured to focus a primary beam of the scanning particle beam microscope on an object region of the particle optical system so that particles are emitted from the object; and
a detector system configured to detect a portion of the emitted particles, the detector system comprising a particle optical detector component configured to generate an electrostatic field in a beam path of the emitted particles,
wherein:
the particle optical detector component comprises a field electrode and a counter electrode arrangement configured so that the electrostatic field is generated between the field electrode and the counter electrode arrangement;
the counter electrode arrangement comprises a first grid electrode portion through which the emitted particles enter into the field;
the counter electrode arrangement comprises a second grid electrode portion through which the emitted particles exit from the field;
the field electrode comprises a passage opening through which the emitted particles pass after the emitted particles enter into the field through the first grid electrode portion and before the emitted particles exit from the field through the second grid electrode portion; and;
in a cross-section of the particle optical detector component taken in a plane extending from a center of the passage opening and oriented perpendicular to a circumferential direction of the passage opening:

at least a portion of the first grid electrode portion is concave toward the field electrode;

at least a portion of the second grid electrode portion is concave toward the field electrode; and a distance between at least the portion of the first grid electrode portion and at least the portion of the second grid electrode portion, measured along a pathway which is parallel to an axis of the passage opening, decreases with decreasing radial distance of the pathway from the axis of the passage opening.

42. The scanning particle microscope of claim 41, wherein:

the emitted particles pass through a principal plane of the objective lens at a location where the principal plane overlaps with an objective lens field of the objective lens; and a beam path of the primary particle beam extends outside the electrostatic field.

43. The scanning particle beam microscope of claim 41, wherein at least the portion of the first grid electrode and at least the portion of the second grid electrode are concave toward the field electrode, each of which having a maximum radius of curvature that is less than three times a diameter of the passage opening.

44. The scanning particle beam microscope of claim 41, wherein at least the portion of the first grid electrode and at least the portion of the second grid electrode are convex toward the field electrode, each of which having a maximum radius of curvature that is less than three times a diameter of the passage opening.

45. The scanning particle beam microscope of claim 41, wherein the emitted particles converge after exiting from the field through the second grid electrode portion.

46. A scanning particle beam microscope configured to inspect an object, the scanning particle beam microscope comprising:

a particle optical system comprising an objective lens configured to focus a primary beam of the microscope on an object region of the particle optical system so that particles are emitted from the object and pass through a principal plane of the objective lens at a location where the principal plane overlaps with an objective lens field of the objective lens; and a detector system, comprising:
   a particle optical detector component configured to generate an electrostatic field in a beam path of the emitted particles; and
   a spatial filter, wherein:
   the electrostatic field is at least partially arranged outside of an objective lens field of the objective lens;
   the particle optical detector component is configured so that a same electric field strength distribution of the electrostatic field interacts with first and second portions of the emitted particles, having different ranges of kinetic energies, to simultaneously generate:
      a first focused intensity profile of the first portion of the emitted particles across the spatial filter having a first degree of focus; and
      a second focused intensity profile of the second portion of the emitted particles across the spatial filter having a second degree of focus;
   the first degree of focus is different from the second degree of focus; and
   the spatial filter and the particle optical detector component are configured so that the difference between the first degree of focus and the second degree of focus causes a detection of the first portion of the emitted particles by the detection system to be suppressed relative to a detection of the second portion of the emitted particles by the detection system; and wherein:
   the particle optical detector component comprises a field electrode and a counter electrode arrangement configured so that the electrostatic field is generated between the field electrode and the counter electrode arrangement;
   the counter electrode arrangement comprises a first grid electrode portion through which the emitted particles enter into the field;
   the counter electrode comprises a second grid electrode portion through which the emitted particles exit from the field;
   the field electrode comprises a passage opening through which the emitted particles pass after the emitted particles enter into the field through the first grid electrode portion and before the emitted particles exit from the field through the second grid electrode portion; and
   in a cross-section of the particle optical detector component taken in a plane extending from a center of the passage opening and oriented perpendicular to a circumferential direction of the passage opening: a) at least a portion of the first grid electrode portion is concave toward the field electrode; and b) at least a portion of the second grid electrode portion is concave toward the field electrode; c) a distance between at least the portion of the first grid electrode portion and at least the portion of the second grid electrode portion, measured along a pathway which is parallel to an axis of the passage opening, decreases with decreasing radial distance of the pathway from the axis of the passage opening.

* * * * *